US011150987B2

(12) United States Patent
Seol et al.

(10) Patent No.: US 11,150,987 B2
(45) Date of Patent: Oct. 19, 2021

(54) METHODS OF CONTROLLING OPERATION OF NONVOLATILE MEMORY DEVICES AND DATA CONVERTERS FOR PERFORMING THE SAME

(71) Applicant: Samsung Electronics Co., Ltd., Suwon-si (KR)

(72) Inventors: Changkyu Seol, Osan-si (KR); Hyejeong So, Hwaseong-si (KR); Kwanwoo Noh, Seoul (KR); Hongrak Son, Anyang-si (KR); Pilsang Yoon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/891,517

(22) Filed: Jun. 3, 2020

(65) Prior Publication Data

US 2021/0157672 A1    May 27, 2021

(30) Foreign Application Priority Data

Nov. 22, 2019  (KR) .......................... 10-2019-0151005

(51) Int. Cl.
| G06F 11/00 | (2006.01) |
| G06F 11/30 | (2006.01) |
| G06F 11/10 | (2006.01) |
| H03M 13/13 | (2006.01) |

(52) U.S. Cl.
CPC ......... *G06F 11/1068* (2013.01); *H03M 13/13* (2013.01)

(58) Field of Classification Search
CPC .... G06F 3/0614; G06F 3/0644; G06F 3/0673; G06F 11/1068; G11C 11/5628; H03M 13/13
See application file for complete search history.

(56) References Cited

U.S. PATENT DOCUMENTS

| 8,756,365 B2 | 6/2014 | Sharon et al. |
| 8,874,994 B2 | 10/2014 | Sharon et al. |
| 9,405,622 B2 | 8/2016 | Varanasi |
| 9,419,653 B1 | 8/2016 | Chaichanavong |

(Continued)

FOREIGN PATENT DOCUMENTS

KR    10-2015-0015808 A    2/2015

*Primary Examiner* — Albert Decady
*Assistant Examiner* — Enamul M Kabir
(74) *Attorney, Agent, or Firm* — Harness, Dickey & Pierce, P.L.C.

(57) ABSTRACT

Channel selection information indicate positions of data bits of input data, positions of error correction code (ECC) parity bits for correcting errors in the input data, and positions of state shaping parity bits. The ECC parity bits and the state shaping parity bits are generated to cause a decrease in a quantity of memory cells, of the plurality of memory cells, in which at least one target state among a plurality of states is programmed. An alignment vector is generated based on aligning the data bits of the input data, the ECC parity bits, and the state shaping parity bits, based on the channel selection information. A codeword is generated based on simultaneously performing state shaping and ECC encoding with respect to the alignment vector. Write data are written in the nonvolatile memory device based on the codeword.

20 Claims, 19 Drawing Sheets

(56) References Cited

U.S. PATENT DOCUMENTS

| | | | |
|---|---|---|---|
| 9,484,098 B1* | 11/2016 | Hsu | G11C 11/5642 |
| 10,114,549 B2 | 10/2018 | Alrod et al. | |
| 2012/0066436 A1* | 3/2012 | Yang | G11C 16/26 |
| | | | 711/103 |
| 2012/0166717 A1* | 6/2012 | Lin | G11C 16/3418 |
| | | | 711/103 |
| 2013/0103891 A1* | 4/2013 | Sharon | G06F 12/0246 |
| | | | 711/103 |
| 2014/0157086 A1* | 6/2014 | Sharon | G06F 12/00 |
| | | | 714/773 |
| 2015/0058536 A1* | 2/2015 | Seol | G06F 12/0246 |
| | | | 711/103 |
| 2015/0199267 A1* | 7/2015 | Oh | G06F 11/1072 |
| | | | 714/766 |
| 2016/0276035 A1* | 9/2016 | So | G11C 29/52 |
| 2016/0313943 A1* | 10/2016 | Hashimoto | G06F 3/0659 |
| 2017/0269839 A1* | 9/2017 | Alrod | G06F 3/0679 |
| 2018/0052733 A1 | 2/2018 | Lee et al. | |
| 2020/0099404 A1* | 3/2020 | Avraham | G06F 17/18 |
| 2020/0192591 A1* | 6/2020 | Navon | G06F 3/0679 |

\* cited by examiner

FIG. 12

|     | S1 | S2  | S3  | S4  | S5  | S6  | S7  | S8 |
|-----|----|-----|-----|-----|-----|-----|-----|----|
| LSB | 1  | 0   | 0   | 0   | 0   | 1   | 1   | 1  |
| CSB | 1  | 1   | 0   | 0   | 1   | 1   | 0   | 0  |
| MSB | 1  | 1   | 1   | 0   | 0   | 0   | 0   | 1  |

| LSB | 1 | 0 | 0 | 0 | 0 | 1 | 1 | 1 |
|---|---|---|---|---|---|---|---|---|
| CSB | 1 | 1 | 0 | 0 | 1 | 1 | 0 | 0 |
| MSB | 1 | 1 | 1 | 0 | 0 | 0 | 0 | 1 |
| STATE | S1 | S2 | S3 | S4 | S5 | S6 | S7 | S8 |

| IND | 0 | 0 | 0 | 0 | 0 | 0 | 1 | 1 |
|---|---|---|---|---|---|---|---|---|

METHODS OF CONTROLLING OPERATION OF NONVOLATILE MEMORY DEVICES AND DATA CONVERTERS FOR PERFORMING THE SAME

CROSS-REFERENCE TO RELATED APPLICATION

This U.S. non-provisional application claims priority under 35 USC § 119 to Korean Patent Application No. 10-2019-0151005, filed on Nov. 22, 2019, in the Korean Intellectual Property Office (KIPO), the disclosure of which is incorporated by reference herein in its entirety.

BACKGROUND

1. Technical Field

Some example embodiments relate generally to semiconductor integrated circuits, and more particularly to methods of controlling an operation of nonvolatile memory devices and data converters for performing the methods.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as vertical NAND memory devices have been developed to increase integration degree and memory capacity of the nonvolatile memory devices. To increase memory capacity, a multi-level cell (MLC) scheme is used such that a plurality of data bits are stored in each memory cell. In the MLC scheme, the number of states programmed in the memory cells is increased, degeneration of memory cells is increased and an operation speed of the memory devices is decreased.

SUMMARY

Some example embodiments may provide a method of controlling an operation of a nonvolatile memory device capable of enhancing reliability of the nonvolatile memory device.

Some example embodiments may provide a data converter and a memory system including the data converter capable of enhancing reliability of a nonvolatile memory device.

According to some example embodiments, a method of controlling an operation of a nonvolatile memory device that is configured to store a plurality of bits in each memory cell of a plurality of memory cells, may include generating channel selection information, the channel selection information indicating positions of data bits of input data, positions of error correction code (ECC) parity bits for correcting errors in the input data, and positions of state shaping parity bits, generating the ECC parity bits, generating the state shaping parity bits to cause a decrease in a quantity of memory cells, of the plurality of memory cells, in which at least one target state among a plurality of states is programmed, generating an alignment vector based on aligning the data bits of the input data, the ECC parity bits, and the state shaping parity bits, wherein the aligning is based on the channel selection information, generating a codeword based on simultaneously performing state shaping and ECC encoding with respect to the alignment vector, and writing write data in the nonvolatile memory device based on the codeword.

According to some example embodiments, a data converter for controlling an operation of a nonvolatile memory device that is configured to store a plurality of bits in each memory cell of a plurality of memory cells, may include a memory storing a program of instructions and a processing circuitry. The processing circuitry may be configured to execute the program of instructions to generate channel selection information indicating positions of data bits of input data, positions of error correction code (ECC) parity bits for correcting errors in the input data, and positions of state shaping parity bits, generate the ECC parity bits, generate the state shaping parity bits to cause a decrease in a quantity of memory cells, of the plurality of memory cells, in which at least one target state among a plurality of states is programmed, generate an alignment vector based on aligning the data bits of the input data, the ECC parity bits, and the state shaping parity bits, based on the channel selection information, and generate a codeword based on simultaneously performing state shaping and ECC encoding with respect to the alignment vector.

According to some example embodiments, a memory system may include a nonvolatile memory device and a memory controller. The nonvolatile memory device may be configured to store a plurality of bits in each of a plurality of memory cells. The memory controller may be configured to control an operation of the nonvolatile memory device. The memory controller may include a memory storing a program of instructions, and a processing circuitry. The processing circuitry may be configured to execute the program of instructions to generate channel selection information indicating positions of data bits of input data, positions of error correction code (ECC) parity bits for correcting errors in the input data, and positions of state shaping parity bits, generate the ECC parity bits, generate the state shaping parity bits to cause a decrease in a quantity of memory cells, of the plurality of memory cells, in which at least one target state among a plurality of states is programmed, generate an alignment vector based on aligning the data bits of the input data, the ECC parity bits, and the state shaping parity bits, based on the channel selection information, and generate a codeword based on simultaneously performing state shaping and ECC encoding with respect to the alignment vector.

BRIEF DESCRIPTION OF THE DRAWINGS

Example embodiments of the present disclosure will be more clearly understood from the following detailed description taken in conjunction with the accompanying drawings.

FIGS. 12 and 13 are diagrams illustrating an example of a read sequence to which a method according to some example embodiments may be applied.

FIGS. 14, 15, 16, 17, and 18 are diagrams illustrating a write operation of a nonvolatile memory device according to some example embodiments.

DETAILED DESCRIPTION

Figure 1:
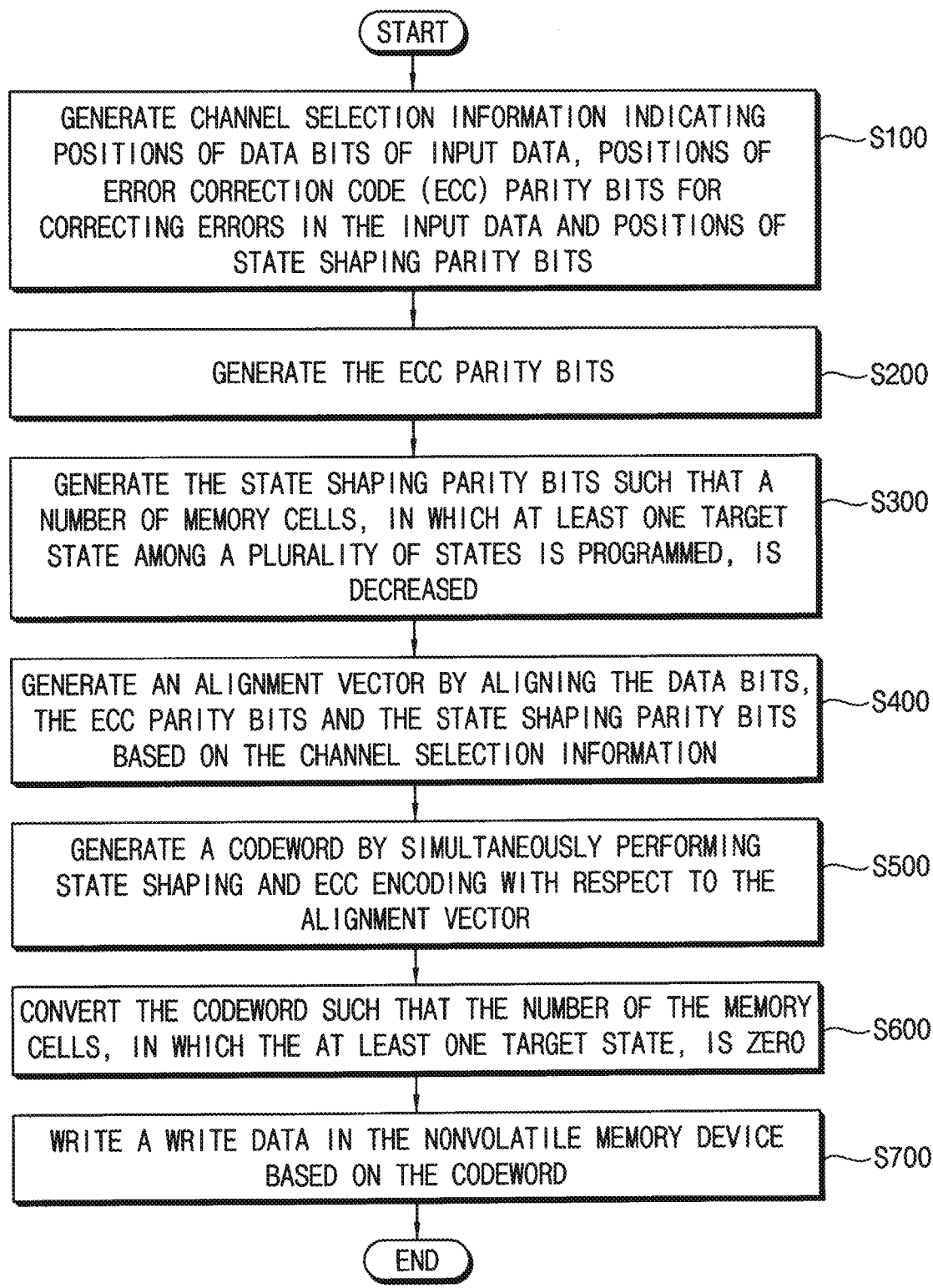
FIG. 1 is a flowchart illustrating a method of controlling an operation of a nonvolatile memory device according to some example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flowchart illustrating method of controlling an operation of a nonvolatile memory device according to some example embodiments.

FIG. 1 illustrates a method controlling an operation of a nonvolatile memory device, which may include any nonvolatile memory device according to any of the example embodiments, including multi-level cells (MLCs) such that each MLC stores a plurality of bits. Restated, the nonvolatile memory device may include a plurality of memory cells and/or may be configured to store a plurality of bits in each memory cell of a plurality of memory cells. The method shown in FIG. 1 may be implemented by some or all of any example embodiment of memory system 10, nonvolatile memory device NVM, memory controller 20, data converter 500, any combination thereof, or the like included in any of the example embodiments herein. It will be understood that, in some example embodiments, one or more of the operations S100-S700 shown in FIG. 1 may be omitted and/or rearranged in order, relative to the order of operations S100-S700 shown in FIG. 1. For example, in some example embodiments, the method shown in FIG. 1 may omit operation S600. In some example embodiments, the method shown in FIG. 1 may further include one or more additional operations, including any of the operations described herein that may be performed with regard to and/or by some or all of any devices described herein, including the memory system 10, memory controller 20, nonvolatile memory device 30, data converter 500, any combination thereof, or the like.

Referring to FIG. 1, channel selection information are generated, the channel selection information indicating positions of data bits of input data, positions of error correction code (ECC) parity bits for correcting errors in the input data, and positions of state shaping parity bits (S100). In some example embodiments, when a polar code is adopted, the channel information may include information on channels that are appropriate for transferring information bits according to channel polarization among a plurality of channels.

The ECC parity bits are generated (S200). In some example embodiments, the ECC parity bits may be generated based on some or all of the input data. In some example embodiments, values of the ECC parity bits are fixed regardless of (e.g., independent of) the input data. For example, all of the ECC parity bits (e.g., each of the ECC parity bits) may have a value of zero. In some example embodiments, the values of the ECC parity bits may be determined, and the ECC parity bits may be generated, depending on the input data. Accordingly, it will be understood that, in some example embodiments, the ECC parity bits may be based on the input data.

The state shaping parity bits are generated such that a number (e.g., quantity) of memory cells of the plurality of memory cells of the nonvolatile memory device, in which at least one target state among a plurality of states is programmed, is decreased (S300). Restated, the state shaping parity bits are generated to cause to cause a decrease in a quantity of memory cells, of the plurality of memory cells, in which at least one target state among a plurality of states is programmed. As will be described below with reference to FIGS. 14 through 19, the at least one target state may include a state having a highest threshold voltage distribution among the plurality of states. It will be understood that "number," as recited herein, may be interchangeably be recited as "quantity."

An alignment vector is generated based on aligning the data bits of the input data, the ECC parity bits and the state shaping parity bits, where the aligning may be based on the channel selection information (S400). The aligning of the data bits will be described below with reference to FIG. 8.

A codeword is generated based on simultaneously performing state shaping and ECC encoding with respect to the alignment vector (S500). In some example embodiments, the alignment vector may be encoded using a polar code to generate the codeword. In some example embodiments, the alignment vector may be encoded based on multiplying a generation matrix of the polar code to the alignment vector. In some example embodiments, the generation matrix may satisfy Expression 5 as presented further below.

The codeword may be converted to write data such that the number of the memory cells, in which the at least one target state is programmed, is zero (S600), and the write data may be written or programmed in the nonvolatile memory device (S700). In some example embodiments, converting the codeword to the write data may be omitted and the write data identical to the codeword may be written in the nonvolatile memory device. Accordingly, it will be understood that the method of FIG. 1 may include writing write date in the nonvolatile memory device based on the codeword.

In conventional schemes, the ECC operation is performed after the state shaping operation or data shaping operation. In some example embodiments, the data shaping is not applied to the ECC parity portion, and thus reliability difference between the memory cells to which the data shaping is applied and the memory cells to which the data shaping is not applied may occur even in the same word line or the same page. Although a specific state may be removed with respect to the data portion to which the data shaping is applied using the conventional schemes, the specific state may not be removed with respect to the ECC parity portion because the ECC encoding is performed after the data shaping.

Example embodiments are provided to reduce or remove the at least one target state so that disturbance and/or coupling between the memory cells due to a particular data pattern may be reduced during the write or program operation in the nonvolatile memory device. According to some example embodiments, the state shaping operation and the ECC encoding operation are performed simultaneously with respect to the alignment vector including the data bits, the state shaping parity bits and the ECC parity bits such that the at least one target state may not be programmed in the memory cells of the nonvolatile memory device.

As such, the method of controlling the operation of the nonvolatile memory device and the data converter according to some example embodiments may enhance the reliability of the nonvolatile memory device and the memory system by simultaneously performing the state shaping operation and the ECC encoding operation to reduce or remove the at least one target state among the plurality of states of the MLC.

The method of controlling the operation of the nonvolatile memory device and the data converter according to some example embodiments may increase an operation speed of the nonvolatile memory device and the memory system by removing the at least one target state having higher threshold voltage distribution to reduce the number of voltages and voltage levels for the program operation and the read operation.

The method of controlling the operation of the nonvolatile memory device and the data converter according to some example embodiments may simplify the configuration of circuitry and reduce size of the circuitry because the state shaping operation and the ECC encoding operation are performed simultaneously using one code such as the polar code.

Figure 2:
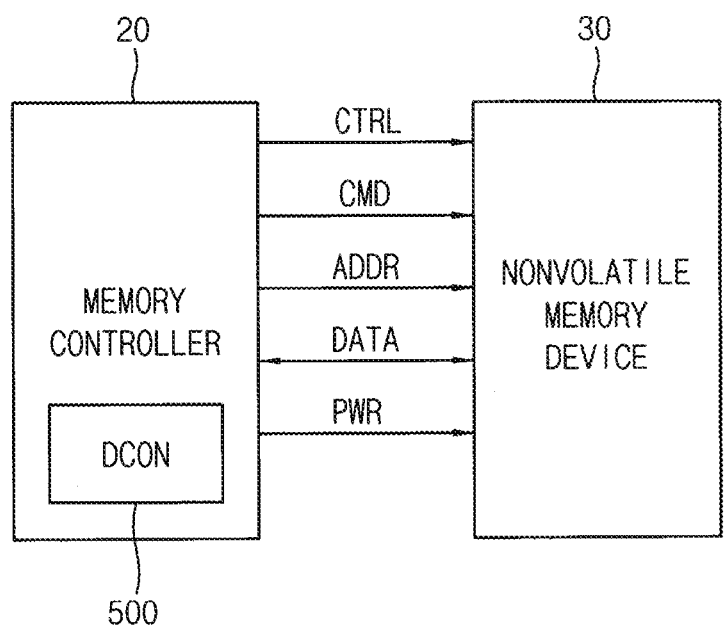
FIG. 2 is a block diagram illustrating a memory system according to some example embodiments.

FIG. 2 is a block diagram illustrating a memory system according to some example embodiments.

Referring to FIG. 2, a memory system 10 may include a memory controller 20 and at least one memory device 30.

The memory device 30 may be a nonvolatile memory device as described herein. The memory device may be configured to store a plurality of bits in each memory cell of a plurality of memory cells (e.g., memory cell array 100). The memory system 10 may include data storage media based on flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

The memory controller 20 may include a data converter 500 for the method of controlling the nonvolatile memory device 30 as described with reference to FIG. 1. Restated, the memory controller 20 may include a data converter 500 configured to control an operation of the nonvolatile memory device 30. The data converter 500 will be described below with reference to FIG. 6.

Figure 3:
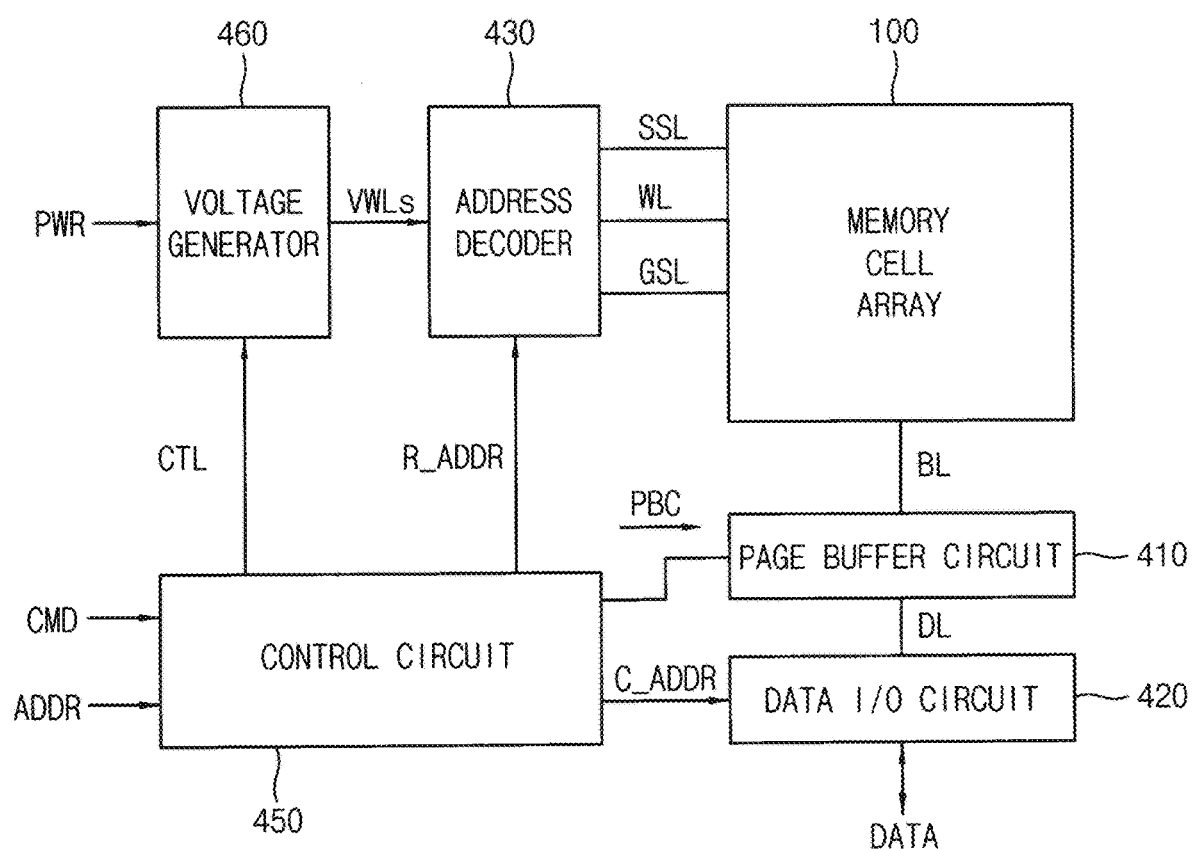
FIG. 3 is a block diagram illustrating a nonvolatile memory device according to some example embodiments.

FIG. 3 is a block diagram illustrating a nonvolatile memory device according to some example embodiments.

Referring to FIG. 3, the nonvolatile memory device 30 includes a memory cell array 100, a page buffer circuit 410, a data input/output circuit 420, an address decoder 430, a control circuit 450 and a voltage generator 460. The nonvolatile memory device 30 may be configured to store a plurality of bits in each memory cell of a plurality of memory cells (e.g., memory cell array 100).

The memory cell array 100 (e.g., a plurality of memory cells) may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In some example embodiments, the memory cell array 100 may include a plurality of NAND strings that are vertically oriented such that at least one memory cell is located over another memory cell.

The control circuit 450 may receive a command (signal) CMD and an address (signal) ADDR from the memory controller 20 and control erasure, programming and read operations of the nonvolatile memory device 30 based on the command signal CMD and the address signal ADDR. An erasure operation may comprise performing a sequence of erase loops, and a program operation may include performing a sequence of program loops. Each program loop may include a program period and a program verification period. Each erase loop may include an erase period and an erase verification period. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine rest of the plurality of string selection lines SSL except for the selected string selection line as unselected string selection lines based on the row address R_ADDR.

The voltage generator 460 may generate word line voltages VWL, which are required for the operation of the memory cell array 100 of the nonvolatile memory device 30, based on the control signals CTL. The voltage generator 460 may receive the power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the first word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In some example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device 30, such as to the memory controller 20). That is, the page buffer circuit 410 and the data input/output circuit 420 may perform a copy-back operation.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 4:
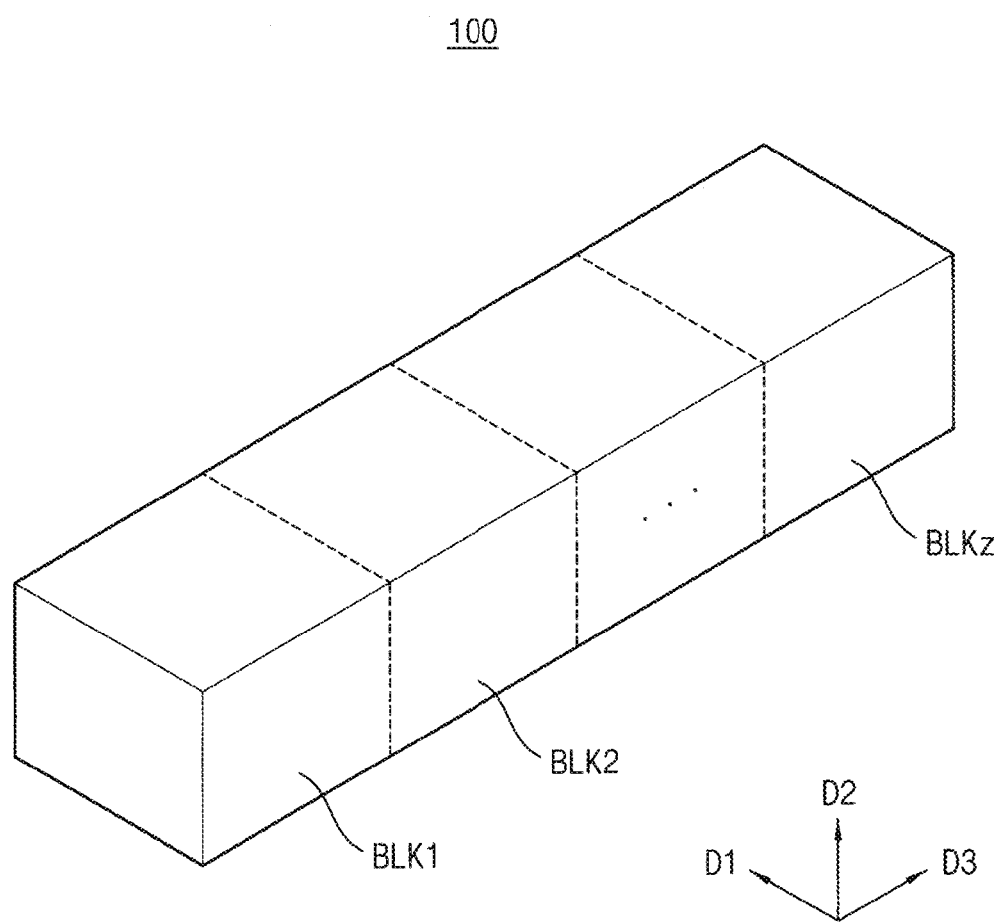
FIG. 4 is a block diagram illustrating a memory cell array included in the nonvolatile memory device of FIG. 3.
Figure 5:
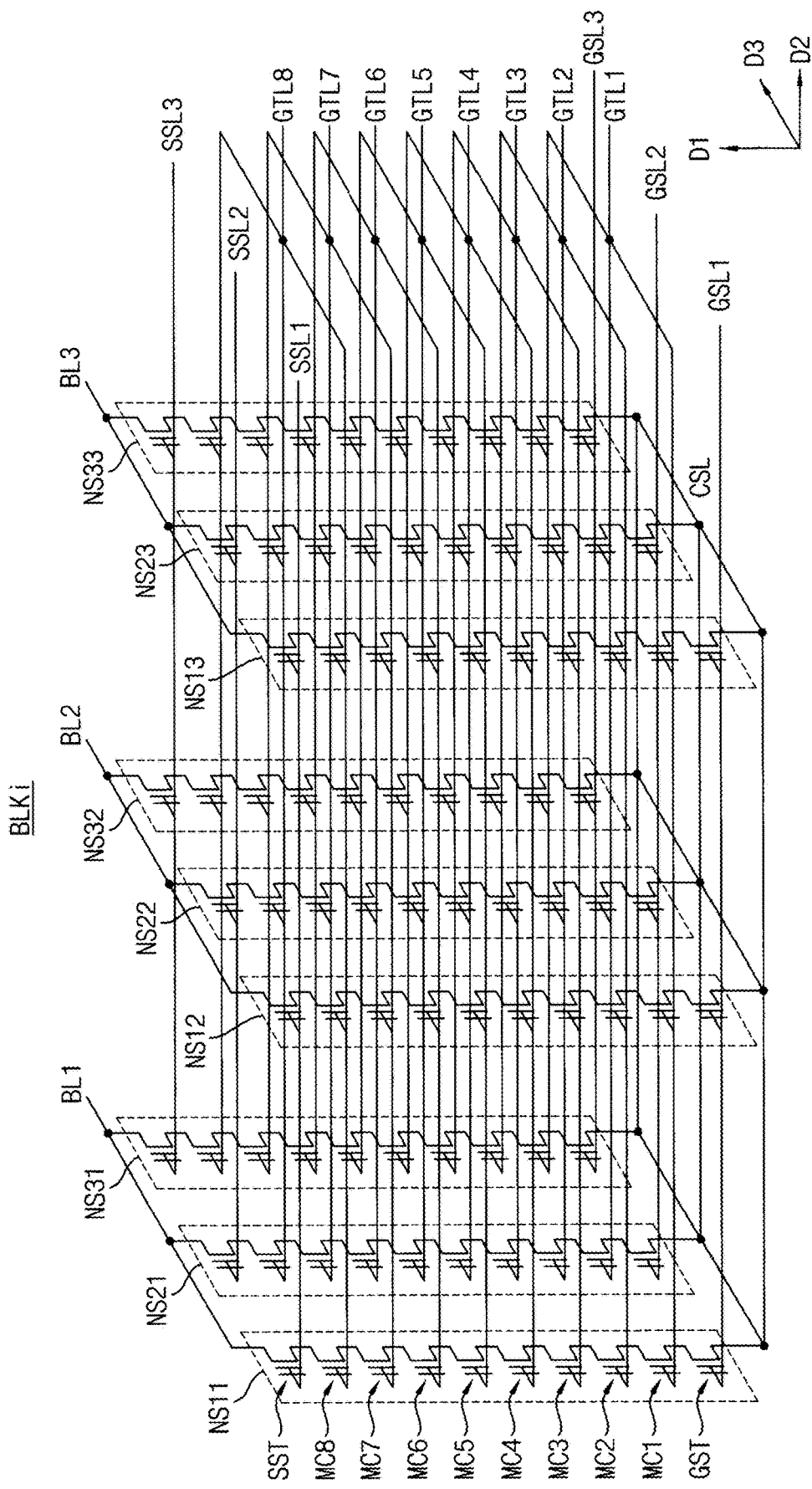
FIG. 5 is a circuit diagram illustrating an equivalent circuit of a memory block described with reference to FIG. 4.

FIG. 4 is a block diagram illustrating a memory cell array included in the nonvolatile memory device of FIG. 3, and FIG. 5 is a circuit diagram illustrating an equivalent circuit of a memory block described with reference to FIG. 4.

Referring to FIG. 4, the memory cell array 100 may include a plurality of memory blocks BLK1 to BLKz, each memory block including one or more memory cells such that the memory cell array 100 includes a plurality of memory cells. In some example embodiments, the memory blocks BLK1 to BLKz are selected by the address decoder 430 in FIG. 3. For example, the address decoder 430 may select a particular memory block BLK corresponding to a block address among the memory blocks BLK1 to BLKz.

The memory block BLKi of FIG. 5 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 5, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 5, each of the NAND strings NS11 to NS33 is illustrated to include eight memory cells MC1 to MC8, which may comprise a plurality of memory cells. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. In addition, some of the gate lines GTL1 to GTL8 may be intermediate switching lines and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 5, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Figure 6:
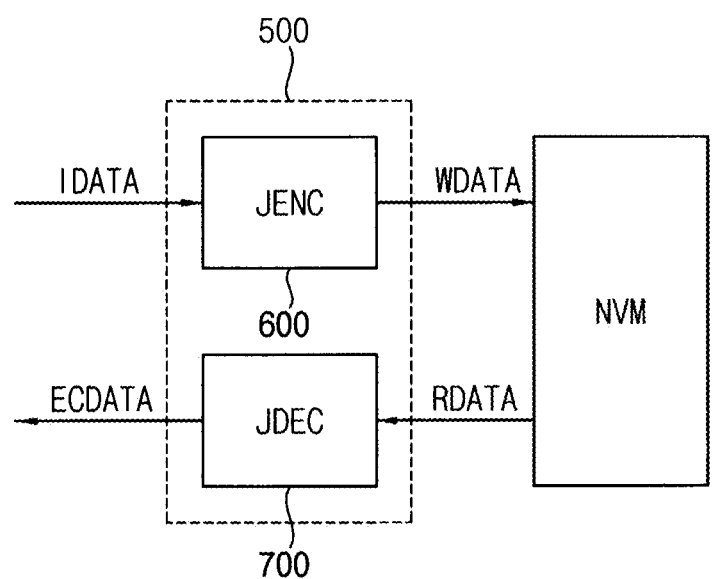
FIG. 6 is a block diagram illustrating a data converter according to some example embodiments.

FIG. 6 is a block diagram illustrating a data converter according to some example embodiments.

Referring to FIG. 6, a data converter 500 may include a joint encoder 600 and a joint decoder 700.

The joint encoder 600 may receive input data IDATA and perform a state shaping operation and an ECC encoding operation with respect to the input data IDATA to generate write data WDATA. The write data WDATA are provided to a nonvolatile memory device NVM to be written in one or more memory cells of the nonvolatile memory device NVM.

The joint decoder 700 may receive read data RDATA read from the nonvolatile memory device NVM and perform an ECC decoding and a deshaping operation with respect to the read data RDATA to correct errors included in the read data RDATA to generate an error-corrected data ECDATA. The nonvolatile memory device NVM may provide (e.g., generate) the read data based on reading data stored in one or more memory cells of the nonvolatile memory device NVM.

The joint decoder 700 may operate in connection with the joint encoder 600. For example, the joint decoder 700 may share information that are used in the joint encoder 600. Even though FIG. 6 illustrates that the joint encoder 600 and the joint decoder 700 are distinct components, the joint encoder 600 and the joint decoder 700 may share a portion of components.

In some example embodiments, the joint encoder 600 may perform the state shaping operation and the ECC encoding operation simultaneously using a polar code. In some example embodiments, the joint encoder 600 may determine (e.g., generate) the state shaping parity bits based on performing successive cancellation encoding or list successive cancellation encoding based on the data bits and the ECC parity bits. The joint decoder 700 may correct errors included in the read data RDATA based on performing successive cancellation decoding or list successive cancellation decoding.

Figure 7:
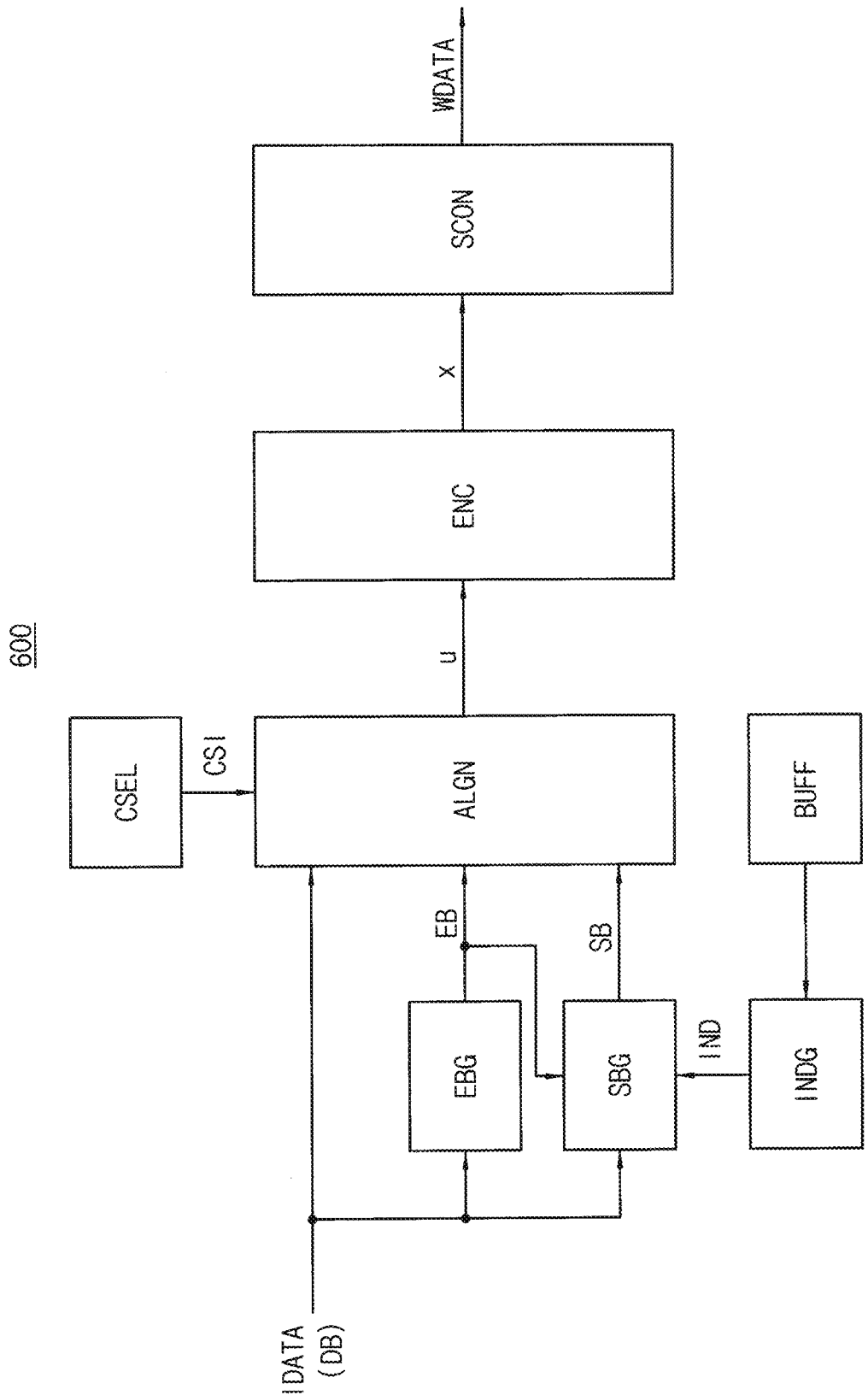
FIG. 7 is a block diagram illustrating some example embodiments of a joint encoder included in the data converter of FIG. 6.

FIG. 7 is a block diagram illustrating some example embodiments of a joint encoder included in the data converter of FIG. 6.

Referring to FIG. 7, the joint encoder 600 may include a channel selector CSEL, an ECC bit generator EBG, a shaping bit generator SBG, a data aligner ALGN, an encoder ENC, a state converter SCON, an indicator data generator INDG and a buffer BUFF. According to some example embodiments, the state converter SCON may be omitted, and the channel selector CSEL may be implemented in an external device such as a processor.

The channel selector CSEL may generate channel selection information CSI indicating positions of data bits DB of input data IDATA, positions of error correction code (ECC) parity bits EB for correcting errors in the input data IDATA, and positions of state shaping parity bits SB.

The ECC bit generator EBG may generate the ECC parity bits EB. The shaping bit generator SBG may generate the state shaping parity bits SB such that a number (e.g., quantity) of memory cells, in which at least one target state among a plurality of states is programmed, is decreased. Restated, the shaping bit generator SBG may generate the state shaping parity bits SB to cause a decrease in a quantity of memory cells, of the plurality of memory cells of the nonvolatile memory device NVM, in which at least one target state among a plurality of states is programmed.

The data aligner ALGN may generate an alignment vector u based on aligning the data bits DB, the ECC parity bits EB, and the state shaping parity bits SB, based on the channel selection information CSI.

The encoder ENC may generate a codeword x based on simultaneously performing state shaping and ECC encoding with respect to the alignment vector u. In some example embodiments, the encoder ENC may encode the alignment vector u using a polar code to generate the codeword x. In some example embodiments, the encoder ENC may simultaneously perform the state shaping operation and the ECC encoding operation by multiplying a generation matrix of the polar code to the alignment vector u, to encode the alignment vector u.

The state converter SCON may convert the codeword x to the write data WDATA such that the number (e.g., quantity) of the memory cells, in which the at least one target state is programmed, may be zero. When the state converter SCON is omitted, the codeword x as it may be provided as the write data WDATA to the nonvolatile memory device.

In some example embodiments, the encoder ENC may encode the alignment vector u using a polar code to generate to codeword x. In some example embodiments, the channel selector CSEL may generate the channel selection information CSI based on one or more values (e.g., a singular value) of a Bhattacharyya parameter. For example, the channel selector CSEL may determine the positions of the shaping parity bits SB in the alignment vector u based on the ascending order of the values of the Bhattacharyya parameter, and determine the positions of the ECC parity bits EB in the alignment vector u based on the descending order of the values of the Bhattacharyya parameter.

In some example embodiments, the ECC bit generator EBG may generate the ECC parity bits EB such that values of the ECC parity bits EB may be fixed regardless of the input data IDATA. For example, when the alignment vector u is encoded using a polar code (e.g., multiplying a generation matrix of the polar code to the alignment vector u), all of the ECC parity bits may have a value of zero, which may be referred to as static frozen bits.

In some example embodiments, the ECC bit generator EBG may generate the ECC parity bits EB such that the values of the ECC parity bits EB may be determined depending on the input data IDATA. In some example embodiments, the data bits DB and the ECC parity bits EB may be combined inseparably as encoded data bits according to ECC schemes, which may be referred to as dynamic frozen bits.

In some example embodiments, the indicator data generator INDG may generate and/or provide indicator data IND based on data previously stored in one or more memory cells, of the plurality of memory cells of the nonvolatile memory device, to which the write data are to be stored.

In some example embodiments, the shaping bit generator SBG may perform successive cancellation encoding or list successive cancellation encoding based on the data bits DB, the ECC parity bits EB and the indicator data IND to generate the state shaping parity bits.

When the bit-mapping of the at least one target state to be reduced or removed is (bi, b2, . . . , bm), the log-likelihood ration (LLR) of the bit b1 of a first page that is firstly written in the MLCs may be determined according to Expressions 1 and 2.

$$LLR=\log 2\{Pr(y=0)/Pr(y=1)\} \qquad \text{Expression 1}$$

$$LLR=\log 2\{p/(1-p)\} \text{ (when } b1=0\text{)}$$

$$LLR=\log 2\{(1-p)/p\} \text{ (when } b1=1\text{)} \qquad \text{Expression 2}$$

In Expressions 1 and 2, y indicates a bit value of the codeword, p indicates a target probability associated with a degree of reduction of the at least one target state, and the target probability is set to be 0.5. As a result, the sign value of the LLR is −1 when b1=0, and the sign value of the LLR is +1 when b1=1, regardless of the bit value of the indicator data.

The LLR of the bit bi (i is an integer greater than 1) of the i-th page may be determined according to Expressions 3 and 4.

$$LLR=\log 2\{Pr(y=0|B)/Pr(y=1|B)\} \qquad \text{Expression 3}$$

$$LLR=\log 2\{p/(1-p)\} \text{ (}bi=0 \text{ and } B=1\text{)}$$

LLR=log 2{(1−p)/p} (when bi=1 and B=1)

LLR=0 (when B=0)                    Expression 4

In Expressions 3 and 4, B indicates a corresponding bit value of the indicator data IND. As a result, the sign value of the LLR is −1 when bi=0 and B=1, and the sign value of the LLR is +1 when bi=1 and B=1, and the value of the LLR is 0 when B=0 regardless of the value of bi.

As such, the shaping parity bits SB may be determined (e.g., generated) based on performing successive cancellation encoding or list successive cancellation encoding referring to the indicator data IND. Restated, values of the state shaping parity bits may be generated based on the indicator data IND.

Figure 8:
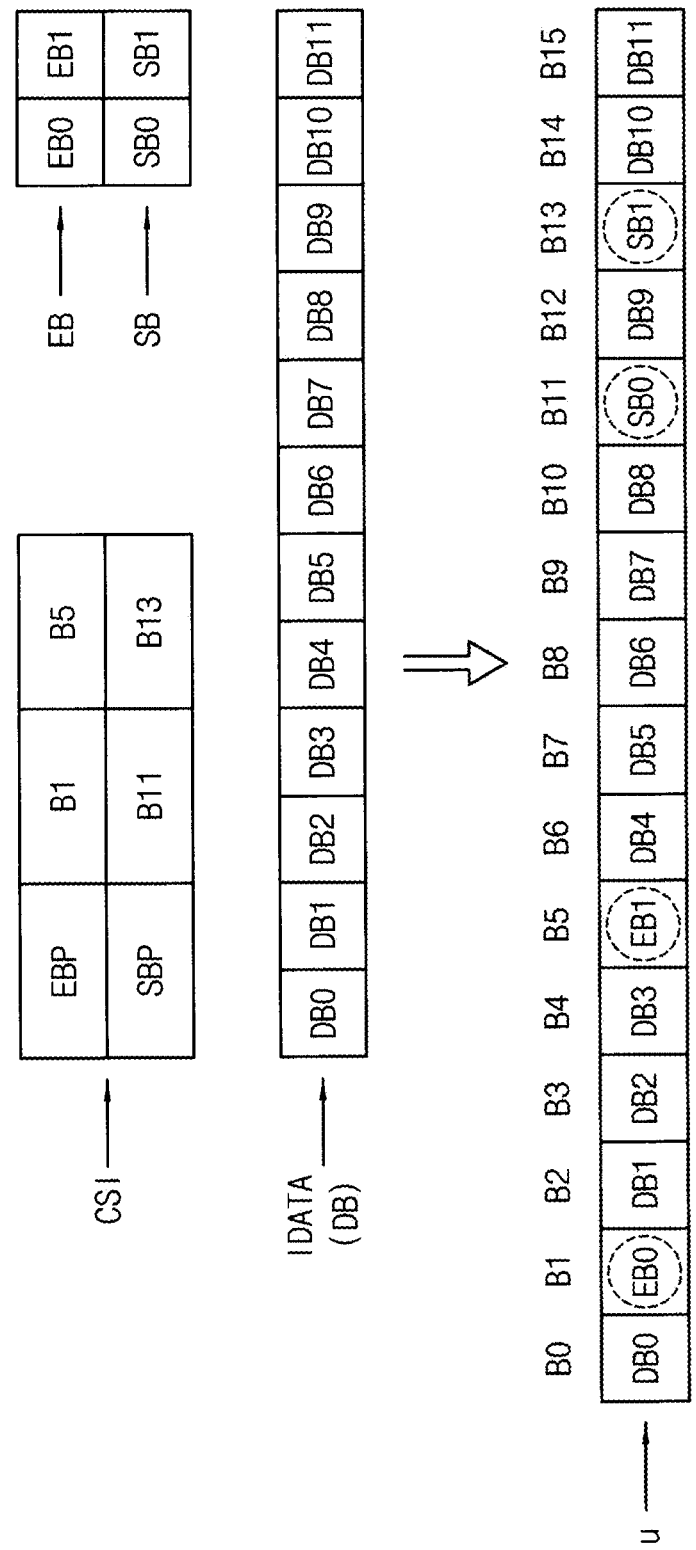
FIG. 8 is a diagram for describing an operation of a data aligner included in the joint encoder of FIG. 7.

FIG. 8 is a diagram for describing an operation of a data aligner included in the joint encoder of FIG. 7.

FIG. 8 illustrates examples of the channel selection information CSI, the ECC parity bits EB, the shaping parity bits SB, the data bits DB of the input data IDATA and the corresponding alignment vector u. The bit numbers shown in FIG. 8 are examples for convenience of illustration and description, and the bit numbers of the channel selection information CSI, the ECC parity bits EB, the shaping parity bits SB and the data bits DB may be determined variously. In real implementations, the bit number of the alignment vector u, which is a unit of data conversion, may be more than several hundred bytes. For example, among the bits of the alignment vector u, about 7% may be assigned as the ECC parity bits EB, about 3% may be assigned as the shaping parity bits SB, and about 90% may be assigned as the data bits DB.

As illustrated in FIG. 8, the data aligner ALGN in FIG. 7 may align the ECC parity bits EB0 and EB1 at the bit positions B1 and B5 of the alignment vector u according to the field EBP in the channel selection information CSI, and align the shaping parity bits SB0 and SB1 at the bit positions B11 and B13 of the alignment vector u according to the field SBP in the channel selection information CSI. The data bits DB0~DB11 may be aligned at the remaining bit positions B0, B2, B3, B4, B6, B7, B8, B9, B10, B12, B14 and B15 of the alignment vector u.

Figure 9:
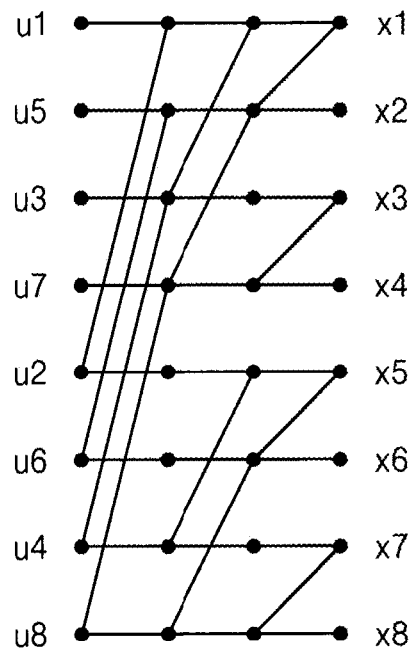
FIGS. 9 and 10 are diagrams for describing encoding and decoding using a polar code.
Figure 10:
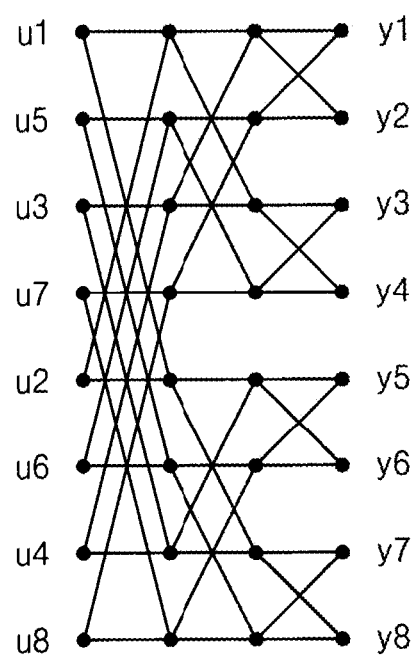

FIGS. 9 and 10 are diagrams for describing encoding and decoding using a polar code.

Channel polarization is an operation by which one constructs, from a first set of N independent copies of a binary input discrete memoryless channel (B-DMC) W, a second set of N binary-input channels $\{W_N^{(i)}:1\leq i\leq N\}$, that show a polarization effect in that, as N becomes large, the fraction of indices i for which the symmetric channel capacity $I(W_N^{(i)})$ is near 1 approaches the channel capacity, denoted by I(W), and the fraction for which $I(W_N^{(i)})$ is near 0 approaches 1−I(W).

The channel polarization operation includes a channel combining phase and a channel splitting phase. A code constructed on the basis of these principles is known as a polar code. Note that in the following descriptions, all scalars, vectors, matrices and operations over them will be carried out in vector spaces over the binary field GF(2). However, example embodiments are not limited to vector spaces over the binary field GF(2), and example embodiments of the present disclosure are applicable to vector spaces over any discrete field GF(N) where N is a positive integer. There are generalization to Arikan's original code where the kernel is no longer a 2×2 matrix, and other generalizations where codes are constructed over a non-binary alphabets.

The notation $a_1^N$ refers to a row vector (a1, ... aN). Polar coding creates a coding system in which one can access each coordinate channel $W_N^{(i)}$ individually and send data only through those for which probability of maximum-likelihood decision error is near 0. In polar coding, $u_1^N$ is encoded into a codeword $x_1^N$ which is sent over the channel WN, and the channel output is $y_1^N$.

Channel combining recursively combines copies of a given B-DMC W to produce a vector channel WN: XN→YN where $N=2^n$, and n is a positive integer. The encoding of the inputs $u_1^N$ to the synthesized channel WN into the inputs $x_1^N$ to the underlying raw channel WN can be expressed as $x_1^N = u_1^N G_N$, where $G_N$ is a generation matrix defined by Expression 5 (e.g., a generation matrix that satisfied Expression 5).

$$G_N = B_N F_2^{\otimes n}$$        Expression 5

In Expression 5, $G_N$ is the generation matrix, $B_N$ is a bit-reversal matrix, $F_2$ is a kernel matrix, ⊗n is an n-th Kronecker power of $F_2$, and $N=2^n$. According to some example embodiments, the bit-reversal matrix $B_N$ may be omitted.

The transition probabilities of the two channels $W_N$ and $W^N$ are related by Expression 6.

$$G_N = B_N F_2^{\otimes n}$$

$$W_N(y_1^N|u_1^N) = W^N(y_1^N|u_1^N G_N)$$        Expression 6

For an arbitrary subset A of {1, ..., N} of size K, Equation 6 may be rewritten as Expression 7.

$$x_1^N = u_A G_N(A) \oplus u_{A^c} G_N(A^c)$$        Expression 7

In Expression 7, $G_N(A)$ represents a submatrix of $G_N$ formed by rows with indices in A. If A and $u_A^c$ are fixed, leaving $u_A$ free, a mapping from source blocks $u_A$ to codewords $x_1^N$ is obtained. A is referred to as the information set, and $u_{A^c} \in X^{N-K}$ is referred to as the frozen bits or vector.

Channel splitting splits $W_N$ back into a set of N binary-input coordinate channels $W_N^{(i)}: X \to Y^N \times X^{i-1}$, $1 \leq i \leq N$, defined by transition probabilities.

$$W_N^{(i)}(y_1^N, u_1^{i-1}|u_i) = \sum_{u_{i+1}^N \in X^{N-i}} \frac{1}{2^{N-1}} W_N(y_1^N|u_1^N)$$    Expression 8

In Expression 8, $(y_1^N, u_1^{i-1})$ represents the output of $W_N^{(i)}$ and the input of $u^i$.

FIG. 9 illustrates an encoder for N=8. The input to the circuit is the bit-reversed version of $u_1^8$, i.e., $\tilde{u}_1^8 = u_1^8 B_8$. Signals flow from left to right. Each edge carries a signal 0 or 1. Each node adds (mod-2) the signals on all incoming edges from the left and sends the result out on all edges to the right. The output is given by $x_1^8 = \tilde{u}_1^8 F^{\otimes 8} = u_1^8 G_8$. In general, the complexity of this implementation is O(N log N) with O(N) for $B_N$ and O(N log N) for $F^{\otimes 3}$.

FIG. 10 illustrates a decoder for N=8. If the channel output is $y_1^N$, the decoder's task is to generate an estimate $\hat{u}_1^N$ of $u_1^N$ given knowledge of A, $u_A^c$, and $y_1^N$. The decoder fixes the frozen part by setting $\hat{u}_A^c = u_A^c$, which reduces the decoding task to generate an estimate $\hat{u}_A$ of $u_A$. The decoder includes decision elements (DEs), one for each element ui of the source vector $u_1^N$, and in general, there is a schedule of node processing over the graph. This is not limited to a specific scheduling, but every decoding algorithm has its own set of possible working schedules, that may depend on the hardware/software resources at hand.

Based on the schedule, processing of data are flooded within the graph where processing is carried in nodes and data are transferred based on edges. For a node ui, the input would be tentative messages that can be used to generate a ratio of interest.

As illustrated in FIG. 10, the DEs can be activated in the order of 1 to N. If i∈A$^c$, the element is known; so, the ith DE, when its turn comes, simply sets ûi=ui and sends this result to all succeeding DEs. Every intermediate node can be activated as soon as its two left neighbor nodes conclude their processing and as soon as certain previous decisions ui are available. If i∈A, the ith DE waits until it has received the previous decisions $\hat{u}_1^{i-1}$ and as soon as its two left nodes conclude their processing, and upon receiving them, can compute based on previous decisions and tentative intermediate node messages, the likelihood ratio (LR) as Expression 9, and generates its decision as Expression 10, which is then sent to all succeeding DEs.

$$L_N^{(i)}(y_1^N, \hat{u}_1^{i-1}) \triangleq \frac{W_N^{(i)}(y_1^N, \hat{u}_1^{i-1} | 0)}{W_N^{(i)}(y_1^N, \hat{u}_1^{i-1} | 1)},$$ Expression 9

$$\hat{u}_i = \begin{cases} 0, & \text{if } L_N^{(i)}(y_1^N, u_1^{i-1}) \geq 1, \\ 1, & \text{otherwise,} \end{cases}$$ Expression 10

The complexity of this algorithm is determined essentially by the complexity of computing the LRs.

Each node in FIG. 10 computes an LR request that arises during the course of the algorithm. Starting from the left side, the first column of nodes correspond to LR requests at length 8 (decision level), the second column of nodes to requests at length 4, the third at length 2, and the fourth at length 1 (channel level). Each node in FIG. 10 carries two labels. The first label indicates the LR value to be calculated, and the second label indicates when this node will be activated. It is to be understood that the schedule of node processing as illustrated in FIG. 10 is an example and non-limiting, and there may be other schedules.

Figure 11:
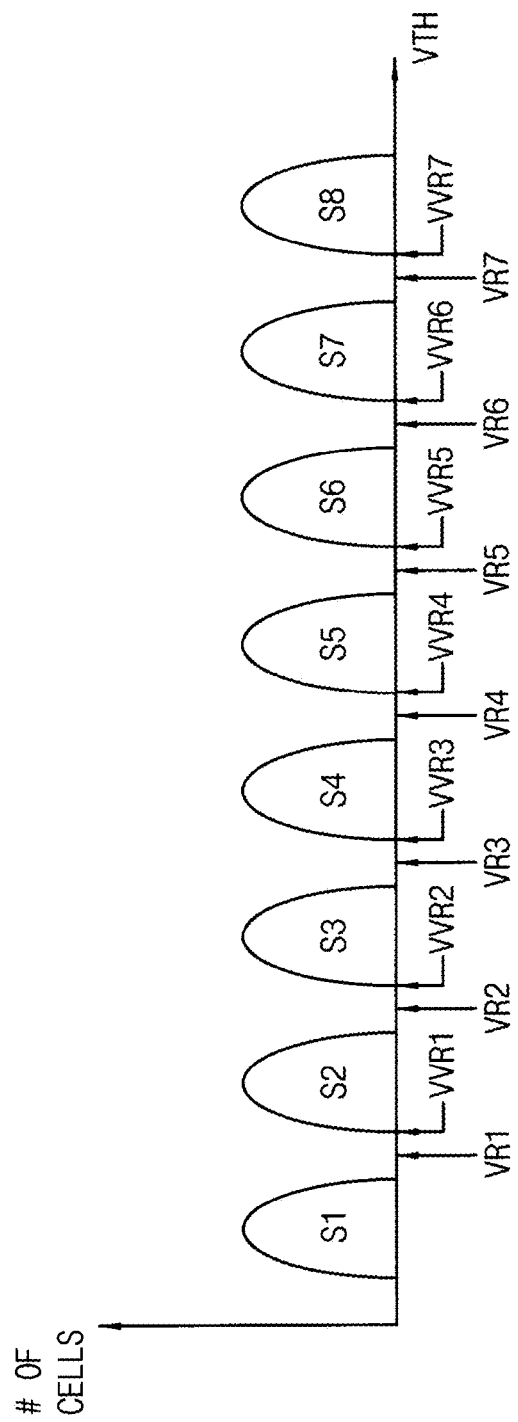
FIG. 11 is a diagram illustrating states of multi-level cells included in a nonvolatile memory device according to some example embodiments.

FIG. 11 is a diagram illustrating states of multi-level cells included in a nonvolatile memory device according to some example embodiments.

FIG. 11 illustrates first through eighth states S1~S8 of triple level cells (TLCs) where each TLC may store three data bits. In FIG. 11, the horizontal axis represents a threshold voltage VTH of memory cells and the vertical axis represents the number of the memory cells corresponding to the threshold voltage VTH. During the program operation, the program success of the first through eighth states S1~S8 may be distinguished by sequentially applying first through seventh verification read voltage VVR1~VVR7 to the selected word line. In addition, during the normal read operation, the first through eighth states S1~S8 may be distinguished by applying at least a portion of first through seventh normal read voltages VR1~VR7 to the selected word line as will be described below with reference to FIGS. 12 and 13.

Figure 13:
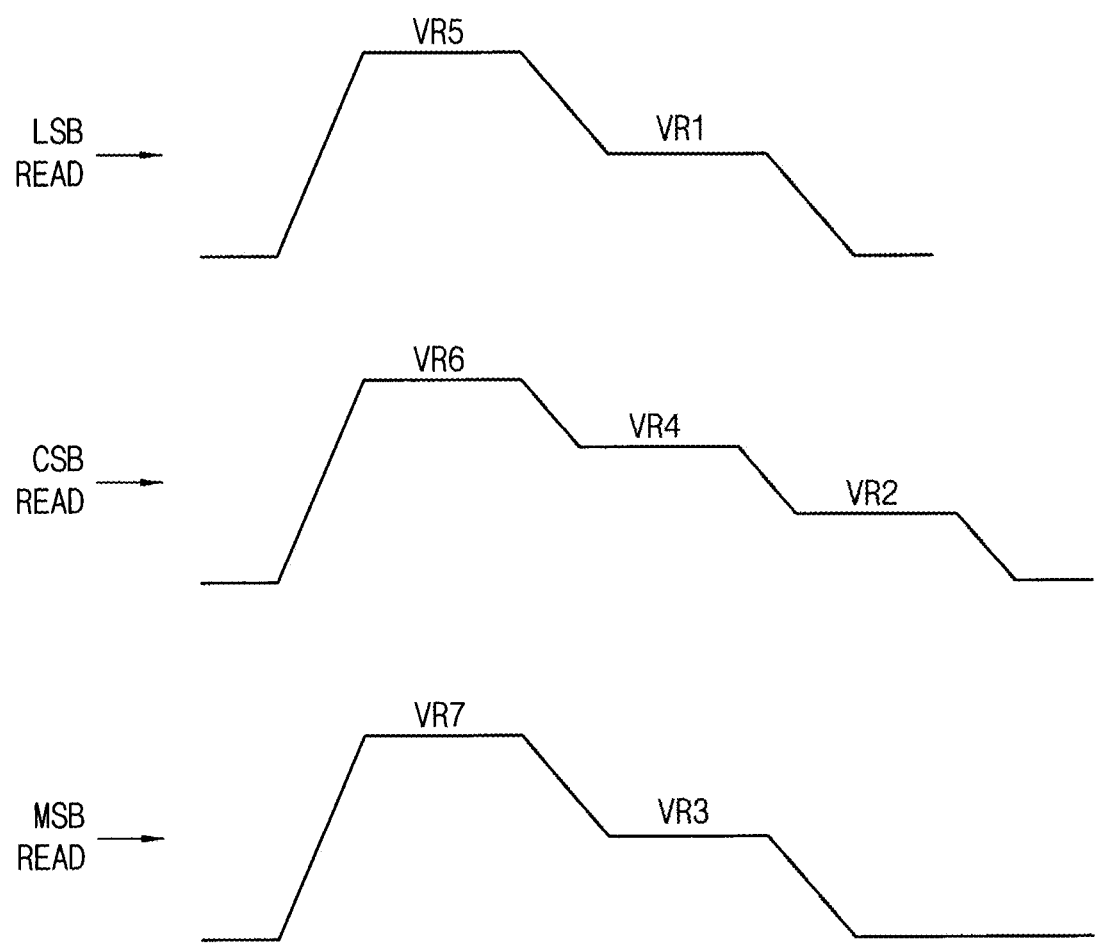

FIGS. 12 and 13 are diagrams illustrating an example of a read sequence to which a method according to some example embodiments may be applied.

FIG. 12 illustrates an example of bit values corresponding to the first through eighth states S1~S8 in FIG. 11. The first through eighth states S1~S8 may be represented by 'BT3 BT2 BT1', that is, different values of first, second and third bits BT1, BT2 and BT3. For example, as illustrated in FIG. 12, the first state corresponds to '111', the second state corresponds to '110', the third state corresponds to '100', the fourth state corresponds to '000', the fifth state corresponds to '010', the sixth state corresponds to '011', the seventh state corresponds to '001', and the eighth state corresponds to '101'.

In some example embodiments, the first bit LSB may be determined using the first read voltage VR1 and the fifth read voltage VR5, the second bit CSB may be determined using the second read voltage VR2, the fourth read voltage V4 and the sixth read voltage VR6, and the third bit MSB may be determined using the third read voltage VR3 and the seventh read voltage VR7.

FIG. 13 illustrates a high-to-low read sequence corresponding to the example of FIG. 12.

In case of reading the first bit LSB, the fifth read voltage VR5 may be applied to the selected word line for the first sensing operation and the first read voltage VR1 may be applied to the selected word line.

In case of reading the second bit CSB, the sixth read voltage VR6, the fourth read voltage VR4 and the second read voltage VR2 may be applied sequentially to the selected word line.

In case of reading the third bit MSB, the seventh read voltage VR7 and the third read voltage VR3 may be applied sequentially to the selected word line.

FIGS. 14, 15, 16, 17, and 18 are diagrams illustrating a write operation of a nonvolatile memory device according to some example embodiments.

Figure 14:
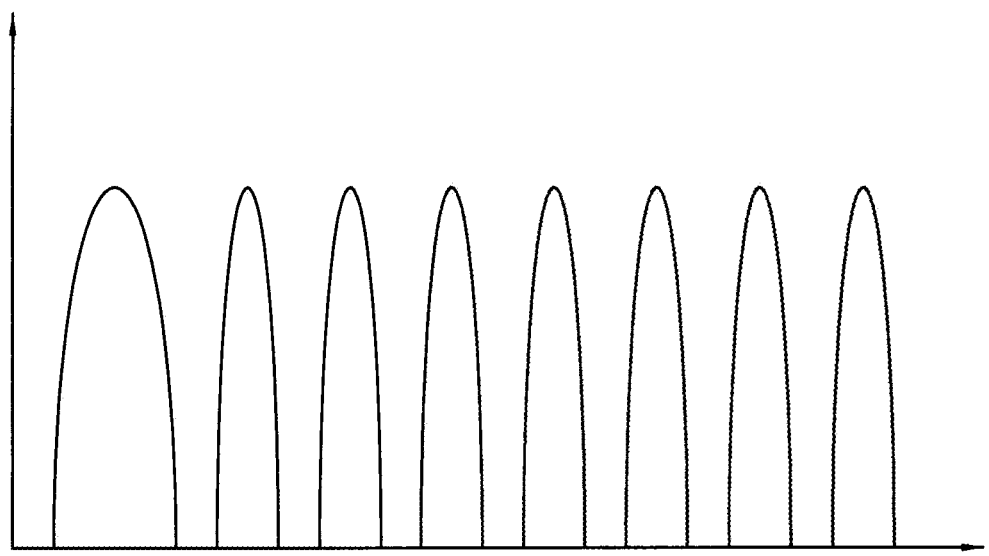

FIG. 14 shows program states of memory cells as illustrated in FIGS. 11 and 12. In FIG. 14, the horizontal axis indicates a threshold voltage and the vertical axis indicates the number of memory cells.

Referring to FIG. 14, LSB, CSB, and MSB may be written in each memory cell, for example. A state of each memory cell may depend on LSB, CSB, and MSB values written in each memory cell. Since eight combinations of LSB, CSB, and MSB are possible, a memory cell at which LSB, CSB, and MSB are written has one of eight states S1 to S8.

Storing LSB of 1, CSB of 1, and MSB of 1, a memory cell has the first state S1. Memory cells having the first state S1 form the lowest range of threshold voltage distribution.

Storing LSB of 0, CSB of 1, and MSB of 1, a memory cell has the second state S2. Memory cells of the second state S2 form a range of threshold voltage distribution higher than the range of threshold voltage distribution of the first state S1.

A memory cell has the third state S3 when storing LSB of 0, CSB of 0, and MSB of 1. Memory cells of the third state S3 form a range of threshold voltage distribution higher than the range of threshold voltage distribution of the second state S2.

Storing LSB of 0, CSB of 0, and MSB of 0, a memory cell has the fourth state S4. Memory cells of the fourth state S4 form a range of threshold voltage distribution higher than the range of threshold voltage distribution of the third state S3.

A memory cell has the fifth state S5 when storing LSB of 0, CSB of 1, and MSB of 0. Memory cells of the fifth state S4 form a range of threshold voltage distribution higher than the range of threshold voltage distribution of the fourth state S4.

A memory cell that has LSB of 1, CSB of 1, and MSB of 0 has the sixth state S6. Memory cells of the sixth state S6 form a range of threshold voltage distribution higher than the range of threshold voltage distribution of the fifth state S5.

If storing LSB of 1, CSB of 0, and MSB of 0, a memory cell has the seventh state S7. Memory cells of the seventh state S7 form a range of threshold voltage distribution higher than the range of threshold voltage distribution of the sixth state S6.

A memory cell has the eighth state S8 when storing LSB of 1, CSB of 0, and MSB of 1. Memory cells of the eighth state S8 form a range of threshold voltage distribution higher than the range of threshold voltage distribution of the seventh state S7.

The bit ordering or bit mapping shown in FIG. 14 is an example. However, example embodiments of the inventive concepts are not limited to the example shown in FIG. 14. Change or modification on the bit ordering may be variously made.

The eighth state S8 has the highest range of threshold voltage distribution. For example, threshold voltages of memory cells of the eighth state S8 are higher than those of memory cells of the first to seventh states S1 to S7. To program the eighth state S8, the highest program voltage has to be applied to the selected word line, and thus most severe degeneration may be caused in the memory cells when the eighth state S8 is programmed or written. The eighth state S8 having the highest threshold voltage distribution may be the at least one target state that is removed according to some example embodiments.

Figure 15:
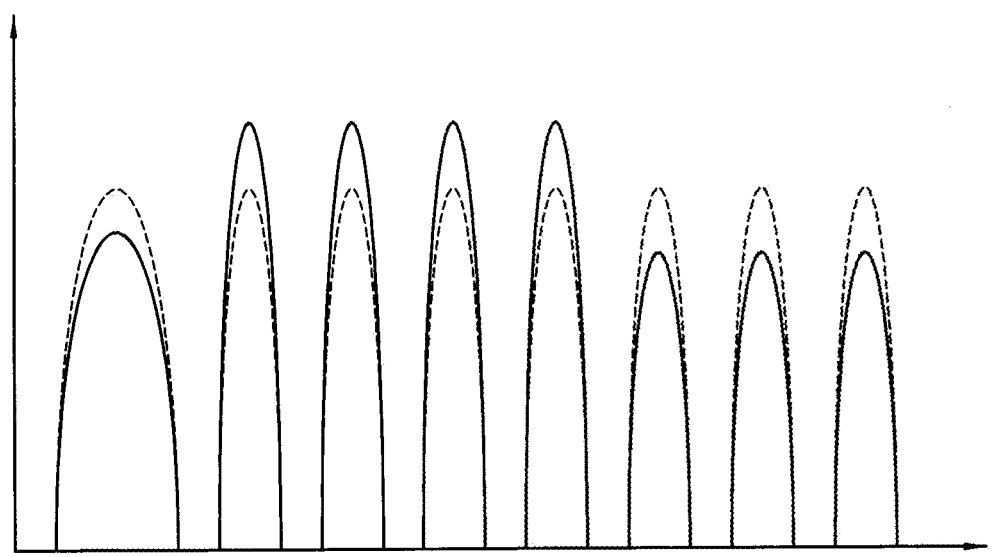
Figure 16:
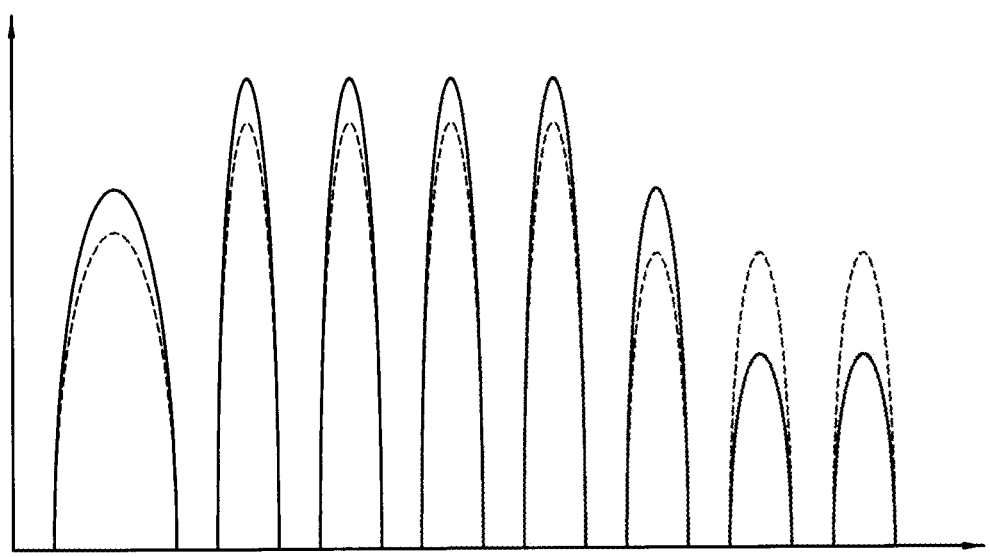

FIGS. 15, 16 and 17 show variations in threshold voltage distributions of memory cells when LSB data, CSB data and MSB data are encoded. In FIGS. 15, 16 and 17, the horizontal axis indicates a threshold voltage and the vertical axis indicates the number of memory cells.

Referring to FIG. 15, when LSB data are written in the memory cells, the write data may be encoded such that there is a decrease in the number of bits corresponding to the eighth state S8 having the highest threshold voltage distribution. For example, write data may be encoded such that the number of bits each corresponding to an LSB value of the eighth state S8 may decrease. In other words, the write data may be encoded such that the number of program states corresponding to an LSB of '1' may be reduced. For example, a portion of '1' bits of the write data may be changed into a '0' bit thus reducing the number of '1' bits in the LSB data of the write data.

In the example shown in FIG. 14, each of the first, sixth, seventh, and eighth states S1, S6, S7, and S8 has an LSB value of 1. If the write data are converted in such a way that the number of '1' bits decreases, the number of memory cells having the first, sixth, seventh, and eighth states S1, S6, S7, and S8 decreases. The number of memory cells having the second to fifth states S2 to S5 also increases because the number of '0' bits of the write data increases.

In FIG. 15, dotted lines indicate threshold voltage distributions of memory cells before the LSB data are encoded, and solid lines indicate threshold voltage distributions of memory cells after the LSB data are encoded.

For example, referred encoding (DE) of the write data may be performed based on the above-mentioned indicator data IND. The referred encoding represents that the indicator data IND are provided based on data previously stored in the memory cells to which the write data are to be stored, and values of the state shaping parity bits are generated referring to the indicator data IND.

For example, each bit of the indicator data may have the value of 1 when the lower bits stored in the memory cells correspond to the lower bits of the at least one target state, and otherwise each bit of the indicator data may have the value of 0.

When no lower bit exists in the memory cells, that is, when the memory cells are remained in the erased state, all bits of the indicator data IND may have the value of 1. When LSB data are encoded, all bits of the indicator data IND may have the value of 1 as illustrated in FIG. 15 because the lower data previously programmed do not exist in the memory cells.

Referring to FIG. 16, the CSB data are written in the memory cells, the write data may be encoded such that the number of bits each corresponding to a CSB value of the eighth state S8 decreases.

When the write data are the CSB data, the LSB data are the lower data of the write data. In case of the referred encoding, there are detected bits, having an LSB value of the eighth state S8 (highest state), from among LSB data (e.g., encoded data) to be written (or, written) in the memory cells. The write data are encoded such that there is a decrease in the number of bits corresponding to the detected bits and to a CSB value of the eighth state S8, from among the write data. For example, in FIG. 16, the CSB of the eighth state S8 (i.e., the highest state) is '0'. Accordingly, the write data are encoded in such a way that the number of bits corresponding to the detected bits and to '0' of a CSB value of the eighth state S8, from among the write data, decreases. For example, encoding is made in such a way that, with respect to write data for which the LSB is '1', the number of CSBs having the value of '0' in such data are decreased.

Among the first to eighth states S1 to S8, the first state S1 and the sixth state S6, the seventh state S7 and the eighth states S8 are states of which the LSB values are the same as an LSB value of the eighth state S8. Among the first state S1 and the sixth state S6, the seventh state S7, the seventh and eighth states S7 and S8 are states of which the CSB values are the same as a CSB value of the eighth state S8. Thus, the number of memory cells of the seventh and eighth states S7 and S8 decreases, and the number of memory cells of the first to sixth states S1 to S6 increases.

In FIG. 16, dotted lines indicate threshold voltage distributions of memory cells after LSB data are encoded and before CSB data are encoded, and solid lines indicate threshold voltage distributions of memory cells after both LSB data and CSB data are encoded.

As illustrated in FIG. 16, the bits of the indicator data IND may have the value of 1 when the LSB data, which is the lower data previously stored in the memory cells, is the same as the LSB bit of the eighth state S8 and otherwise the bits of the indicator data IND may have the value of 0.

Referring to FIG. 17, when MSB data are written in the memory cells, the write data may be encoded such that the number of bits each corresponding to an MSB value of the eighth state S8 decreases.

When the write data are the MSB data, the LSB data and the CSB data are the lower data of the write data being the MSB data. In case of the referred encoding, there are detected bits, having an LSB value and a CSB value of the eighth state S8 (highest state), from among the LSB data and the CSB data to be written in the memory cells. For example, locations (e.g., locations of memory cells) are detected where bits, corresponding to an LSB value of the eighth state S8, of the LSB data are written and bits, corresponding to a CSB value of the eighth state S8, of the CSB data are written. The write data are encoded in such a way that the number of bits, corresponding to the detected locations and to a MSB value of the eighth state S8, from among the write data decreases. For example, the write data are encoded in such a way that the number of bits, corresponding to the detected locations and to '1' of an MSB value of the eighth state S8, from among the write data decreases. For example, data are encoded in such a way that, with respect to write data for which the LSB is '1' and the CSB is '0', the number of MSBs having the value of '1' is decreased.

Among the first to eighth states S1 to S8, the seventh and eighth states S7 and S8 are states of which the LSB and CSB values are the same as an LSB value of the highest state, that is, the eighth state S8. The seventh state S7 does not have the same MSB value as the eighth state S8. Thus, the write data are encoded in such a way that the number of memory cells of the eighth state S8 decreases, and the number of memory cells of the first to seventh states S1 to S7 increases.

In FIG. 17, dotted lines indicate threshold voltage distributions of memory cells after the LSB data and the CSB data are encoded and before the MSB data are encoded, and solid lines indicate threshold voltage distributions of memory cells after both the LSB data, the CSB data, and the MSB data all are encoded.

As illustrated in FIG. 17, the bits of the indicator data IND may have the value of 1 when the LSB data and the CSB data, which are the lower data previously stored in the memory cells, are the same as the LSB bit and the CSB bit of the eighth state S8 and otherwise the bits of the indicator data IND may have the value of 0.

Figure 18:
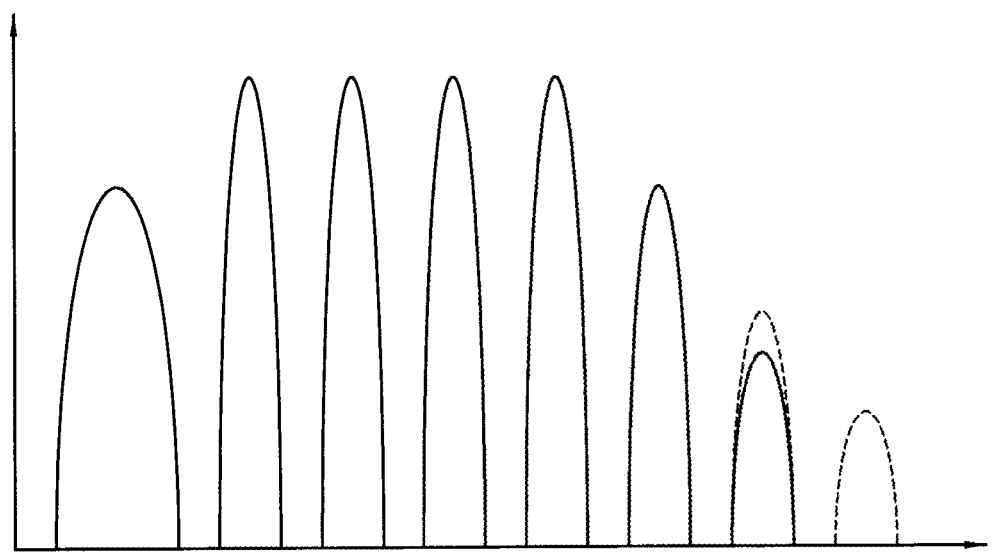

Referring to FIGS. 7 and 18, the state converter SCON may convert the codeword x to the write data WDATA such that the number (e.g., quantity) of the memory cells, in which the at least one target state (e.g., the eighth state S8) is programmed, may be zero.

For example, the state converter SCON may invert bit values of the codeword corresponding to the at least one target state (e.g., the eighth state S8) in response to a determination, which may be made at the state converter SCON, that the write data are a most significant data to be stored in one or more memory cells of the memory cells of the nonvolatile memory device (e.g., some or all of the memory cells). The state converter SCON may be disabled to maintain the codeword as the write data in response to a determination, which may be made at the state converter SCON, that the write data are not the most significant data to be stored in the one or more memory cells of the memory cells of the nonvolatile memory device (e.g., some or all of the memory cells), as described with reference to FIGS. 15 and 16. Accordingly, it will be understood that the converting by the state converter SCON may include selectively inverting bit values of the codeword corresponding to the at least one target state in response to a determination of whether the write data are a most significant data to be stored in one or more memory cells of the memory cells of the nonvolatile memory device (e.g., some or all of the memory cells).

As a result, the value of '101' corresponding to the eighth state S8 may be converted to the value of '001' corresponding to the seventh state S7. As such, the number of the memory cells in which the eighth state S8 is programmed may be zero, while the number of the memory cells in which the seventh state S7 is programmed may be increased.

The number of the program verification voltages for the program operation and the number of the read voltages for the read operation may be reduced.

The write data may be programmed in the memory cells using L-M-1 program verification voltages in response to a determination, which may be made at the state converter SCON and/or nonvolatile memory device NVM, that a number (e.g., quantity) of states comprising the plurality of states is L and a number (e.g., quantity) of target states comprising the at least one target state is M. In addition, the data stored in the nonvolatile memory device may be read out using L-M-1 read voltages in response to a determination, which may be made at the joint decoder 700 and/or nonvolatile memory device NVM, that a number (e.g., quantity) of states of the plurality of states is L and a number (e.g., quantity) of target states of the at least one target state is M.

In the example of FIG. 18, the number (e.g., quantity) of the states L of the triple level cells is 8, the at least one target state is the eighth state S8 and the number (e.g., quantity) of the at least one target state is 1. In comparison with the case of FIG. 11, the seventh program verification voltage VVR7 may be removed in the program operation or the write operation, and the seventh read voltage VR7 may be removed by removing the target state S8 corresponding to the at least one target state as illustrated in FIG. 18.

As such, the method of controlling the operation of the nonvolatile memory device and the data converter according to some example embodiments may increase an operation speed of the nonvolatile memory device and the memory system by removing the at least one target state having higher threshold voltage distribution to reduce the number of voltages and voltage levels for the program operation and the read operation. Also the degeneration of the memory cells due to the high voltages may be reduced by removing the at least one target state having higher threshold voltage distribution.

Figure 19:
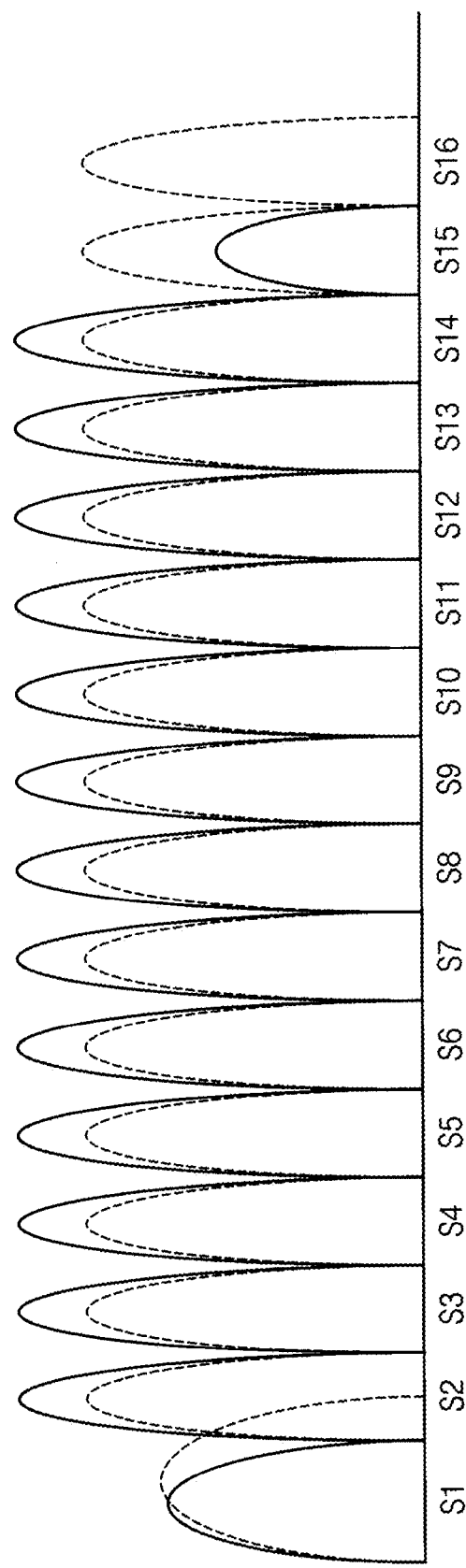
FIG. 19 is a diagram illustrating states that are programmed by a method of controlling an operation of a nonvolatile memory device according to some example embodiments.

FIG. 19 is a diagram illustrating states that are programmed by a method of controlling an operation of a nonvolatile memory device according to some example embodiments.

FIG. 19 illustrates first through sixteenth states S1~S16 of quadruple level cells (QLCs) where each QLC may store four data bits. Example embodiments of the QLCs are substantially the same as the TLCs of FIGS. 11 through 18, and repeated descriptions are omitted.

In FIG. 19, dotted lines indicate threshold voltage distributions of memory cells before the write data are encoded, and solid lines indicate threshold voltage distributions of memory cells after the write data are encoded. The sixteenth state S16 having the highest threshold voltage distribution may be the at least one target state to be removed.

When the number of the memory cells corresponding to the at least one target state S16 is reduced or removed according to the bit-mapping, also the number of the memory cells corresponding to other states (e.g., the fifteenth state S15) may be reduced. In the program operation with the at least one target state being reduced or removed, the application of the high voltages to the memory cells may be reduced, and thus the degeneration due to program disturbance may be reduced. As illustrated in FIG. 19, the first state S1 corresponding to the erased state may be spread as represented by the dotted line due to the program disturbance, and the spread of the distribution may be reduced as represented by the solid line by removing the at least one target state having the higher threshold voltage distribution. Accordingly, the degeneration of the memory cells may be reduced and the performance of the nonvolatile memory device may be enhanced according to some example embodiments.

Figure 20:
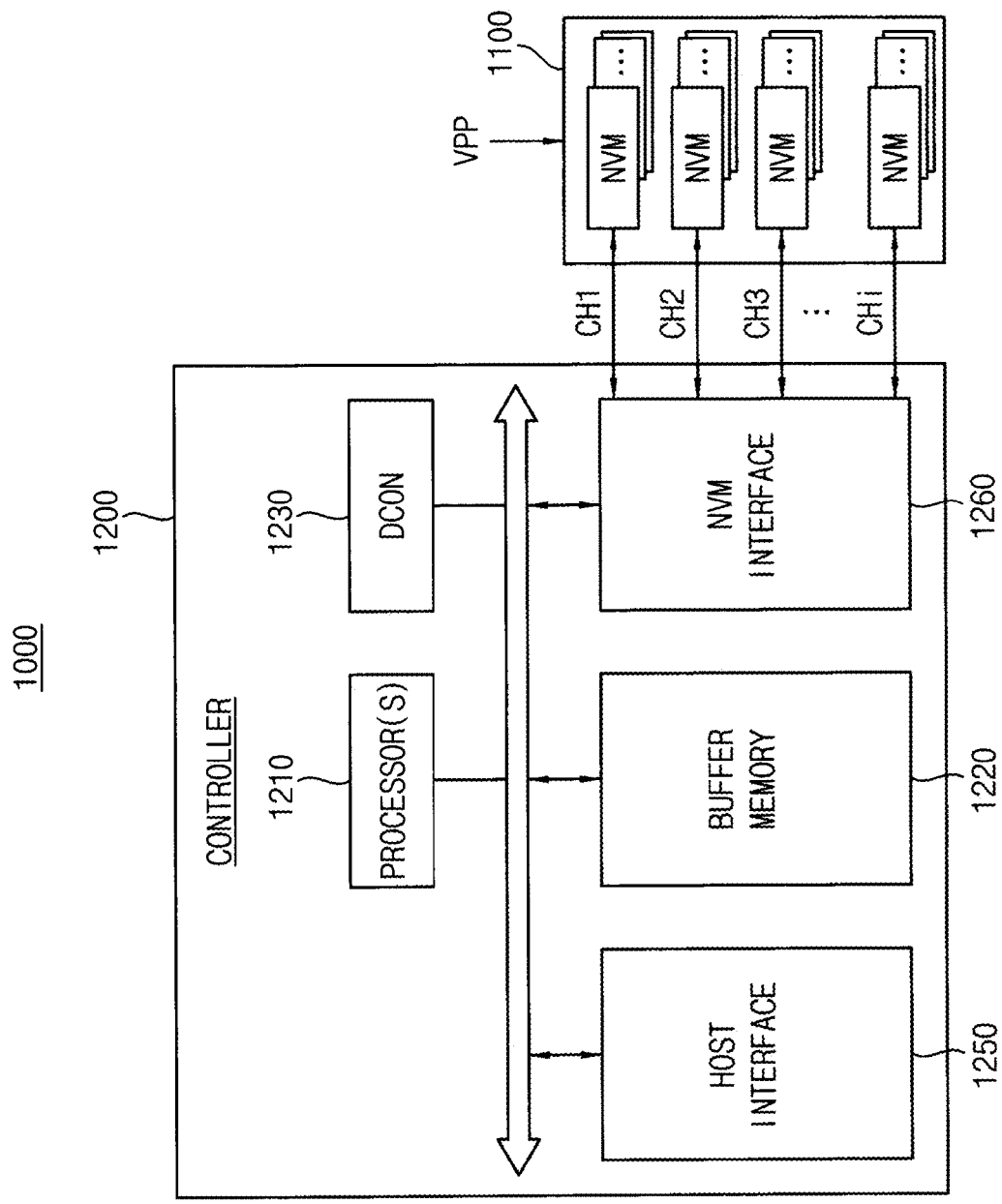
FIG. 20 is a block diagram illustrating a solid state disk or solid state drive (SSD) according to some example embodiments.

FIG. 20 is a block diagram illustrating a solid state disk or solid state drive (SSD) according to some example embodiments.

Referring to FIG. 20, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may be the above-described memory devices disclosed above.

The SSD controller 1200 is connected to the nonvolatile memory devices 1100 through multiple channels CH1 to CHi. The SSD controller 1200 includes one or more processors 1210, a buffer memory 1220, a data converter 1230, a host interface 1250, and a nonvolatile memory interface 1260. The buffer memory 1220 stores data used to drive the SSD controller 1200. In addition, the buffer memory 1220 may temporarily store data for read and write operations. As described above, the data converter 1230 may enhance the reliability of the nonvolatile memory devices 1100 and the memory system such as the SSD 1000 by simultaneously performing the state shaping operation and the ECC encoding operation to reduce or remove the at least one target state among the plurality of states of the MLC.

The example embodiments of the inventive concepts may be applied to nonvolatile memory devices and systems including the nonvolatile memory device. For example, the example embodiments of the inventive concepts may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

In some example embodiments, some or all of any of the systems according to any of the example embodiments, including some or all of memory system 10, nonvolatile memory device 30, memory controller 20, data converter 500, joint encoder 600, SSD 1000, SSD controller 1200, and/or nonvolatile memory device 1100 according to any of the example embodiments, may include, may be included in, and/or may be implemented by one or more instances (e.g., articles, pieces, units, etc.) of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, or memory, for example a solid state drive (SSD), storing a program of instructions, and a processor (e.g., processing circuitry) configured to execute the program of instructions to implement the functionality of some or all of any of the systems according to any of the example embodiments. It will be understood that, as described herein, an element (e.g., processing circuitry, digital circuits, etc.) that is described as "implementing" an element (e.g., channel selector CSEL, ECC bit generator EBG, etc.) will be understood to implement the functionality of said implemented element (e.g., the functionality of channel selector CSEL, the functionality of ECC bit generator EBG, etc.).

The foregoing is illustrative of some example embodiments and is not to be construed as limiting thereof. Although some example embodiments have been described, those skilled in the art will readily appreciate that many modifications are possible in the example embodiments without materially departing from the present inventive concepts.

What is claimed is:

1. A method of controlling an operation of a nonvolatile memory device that is configured to store a plurality of bits in each memory cell of a plurality of memory cells, the method comprising:

generating channel selection information, the channel selection information indicating positions of data bits of input data, positions of error correction code (ECC) parity bits for correcting errors in the input data, and positions of state shaping parity bits;

generating the ECC parity bits;

generating the state shaping parity bits to cause a decrease in a quantity of memory cells, of the plurality of memory cells, in which at least one target state among a plurality of states is programmed;

generating an alignment vector based on aligning the data bits of the input data, the ECC parity bits, and the state shaping parity bits, wherein the aligning is based on the channel selection information;

generating a codeword based on simultaneously performing state shaping and ECC encoding with respect to the alignment vector; and writing write data in the nonvolatile memory device based on the codeword.

2. The method of claim 1, wherein values of the ECC parity bits are fixed independent of the input data.

3. The method of claim 2, wherein all of the ECC parity bits have a value of zero.

4. The method of claim 1, wherein values of the ECC parity bits are based on the input data.

5. The method of claim 1, wherein the generating the codeword comprises:

encoding the alignment vector using a polar code to generate the codeword.

6. The method of claim 5, wherein encoding the alignment vector comprises:

multiplying a generation matrix of the polar code to the alignment vector.

7. The method of claim 6, wherein the generation matrix satisfies $G_N = F_2^{\otimes n}$ where $G_N$ is the generation matrix, $F_2$ is a kernel matrix, $\otimes n$ is an n-th Kronecker power of $F_2$, and $N=2^n$.

8. The method of claim 1, wherein the at least one target state includes a state having a highest threshold voltage distribution among the plurality of states.

9. The method of claim 1, wherein the generating the state shaping parity bits includes performing successive cancellation encoding or list successive cancellation encoding.

10. The method of claim 1, wherein the generating the state shaping parity bits includes generating indicator data based on data previously stored in one or more memory cells, of the plurality of memory cells, to which the write data are to be stored; and generating values of the state shaping parity bits based on the indicator data.

11. The method of claim 1, further comprising:

converting the codeword to the write data such that the quantity of memory cells in which the at least one target state is programmed is zero.

12. The method of claim 11, wherein the converting the codeword to the write data comprises:
selectively inverting bit values of the codeword corresponding to the at least one target state in response to a determination of whether the write data are a most significant data to be stored in one or more memory cells of the plurality of memory cells.

13. The method of claim 1, wherein the write data are programmed in the memory cells using L-M-1 program verification voltages in response to a determination that a quantity of states of the plurality of states is L and a quantity of target states of the at least one target state is M.

14. The method of claim 1, further comprising:
reading data stored in the nonvolatile memory device to generate read data; and
correcting errors included in the read data based on performing successive cancellation decoding or list successive cancellation decoding.

15. The method of claim 14, wherein the data stored in the nonvolatile memory device are read out using L-M-1 read voltages in response to a determination that a quantity of states of the plurality of states is L and a quantity of target states of the at least one target state is M.

16. The method of claim 1, wherein the channel selection information are generated based on a value of a Bhattacharyya parameter.

17. A data converter for controlling an operation of a nonvolatile memory device that is configured to store a plurality of bits in each memory cell of a plurality of memory cells, the data converter comprising:
a memory storing a program of instructions; and
a processing circuitry configured to execute the program of instructions to
generate channel selection information indicating positions of data bits of input data, positions of error correction code (ECC) parity bits for correcting errors in the input data, and positions of state shaping parity bits;
generate the ECC parity bits;
generate the state shaping parity bits to cause a decrease in a quantity of memory cells, of the plurality of memory cells, in which at least one target state among a plurality of states is programmed;
generate an alignment vector based on aligning the data bits of the input data, the ECC parity bits, and the state shaping parity bits, based on the channel selection information; and
generate a codeword based on simultaneously performing state shaping and ECC encoding with respect to the alignment vector.

18. The data converter of claim 17, wherein the processing circuitry is configured to execute the program of instructions to encode the alignment vector using a polar code to generate the codeword.

19. A memory system, comprising:
a nonvolatile memory device configured to store a plurality of bits in each memory cell of a plurality of memory cells; and
a memory controller configured to control an operation of the nonvolatile memory device, the memory controller including
a memory storing a program of instructions, and
a processing circuitry configured to execute the program of instructions to
generate channel selection information indicating positions of data bits of input data, positions of error correction code (ECC) parity bits for correcting errors in the input data, and positions of state shaping parity bits;
generate the ECC parity bits;
generate the state shaping parity bits to cause a decrease in a quantity of memory cells, of the plurality of memory cells, in which at least one target state among a plurality of states is programmed;
generate an alignment vector based on aligning the data bits of the input data, the ECC parity bits, and the state shaping parity bits, based on the channel selection information; and
generate a codeword based on simultaneously performing state shaping and ECC encoding with respect to the alignment vector.

20. The memory system of claim 19, wherein the processing circuitry is configured to execute the program of instructions to encode the alignment vector using a polar code to generate the codeword.

* * * * *